United States Patent
Wu et al.

(10) Patent No.: US 12,402,378 B2
(45) Date of Patent: Aug. 26, 2025

(54) SEMICONDUCTOR ARRANGEMENT INCLUDING FIRST AND SECOND GATE ELECTRODES AND METHOD OF MANUFACTURE

(71) Applicant: Taiwan Semiconductor Manufacturing Company Limited, Hsin-Chu (TW)

(72) Inventors: Yun-Chi Wu, Tainan (TW); Tsung-Yu Yang, Tainan (TW); Cheng-Bo Shu, Tainan (TW); Chien Hung Liu, Hsinchu County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 18/432,471

(22) Filed: Feb. 5, 2024

(65) Prior Publication Data

US 2024/0258374 A1   Aug. 1, 2024

Related U.S. Application Data

(63) Continuation of application No. 18/106,001, filed on Feb. 6, 2023, now Pat. No. 11,894,425, which is a
(Continued)

(51) Int. Cl.
  *H10D 62/13*   (2025.01)
  *H01L 21/02*   (2006.01)
(Continued)

(52) U.S. Cl.
  CPC ..... *H10D 62/151* (2025.01); *H01L 21/02164* (2013.01); *H01L 21/0276* (2013.01);
(Continued)

(58) Field of Classification Search
  CPC ........... H01L 29/0847; H01L 21/02164; H01L 21/0276; H01L 21/2652; H01L 21/266;
(Continued)

(56) References Cited

U.S. PATENT DOCUMENTS 5,904,528 A    5/1999  Lin et al.
5,972,783 A   10/1999  Arai et al.
(Continued)

OTHER PUBLICATIONS

U.S. Appl. No. 62/753,152 Drawings.*
(Continued)

*Primary Examiner* — J. E. Schoenholtz
(74) *Attorney, Agent, or Firm* — Cooper Legal Group, LLC

(57) ABSTRACT

A method of forming a semiconductor arrangement includes forming a gate dielectric layer over a semiconductor layer. A gate electrode layer is formed over the gate dielectric layer. A first gate mask is formed over the gate electrode layer. The gate electrode layer is etched using the first gate mask as an etch template to form a first gate electrode. A first dopant is implanted into the semiconductor layer using the first gate mask and the first gate electrode as an implantation template to form a first doped region in the semiconductor layer.

20 Claims, 16 Drawing Sheets

Related U.S. Application Data continuation of application No. 17/098,751, filed on Nov. 16, 2020, now Pat. No. 11,575,008, which is a continuation of application No. 16/371,535, filed on Apr. 1, 2019, now Pat. No. 10,840,333.

(60) Provisional application No. 62/753,152, filed on Oct. 31, 2018.

(51) Int. Cl.

| | | |
|---|---|---|
| *H01L 21/027* | (2006.01) | |
| *H01L 21/265* | (2006.01) | |
| *H01L 21/266* | (2006.01) | |
| *H01L 21/311* | (2006.01) | |
| *H01L 21/3213* | (2006.01) | |
| *H10B 10/00* | (2023.01) | |
| *H10D 30/01* | (2025.01) | |
| *H10D 30/60* | (2025.01) | |
| *H10D 64/01* | (2025.01) | |
| *H10D 84/01* | (2025.01) | |
| *H10D 84/03* | (2025.01) | |
| *H10D 84/85* | (2025.01) | |

(52) U.S. Cl.
CPC ........ *H01L 21/2652* (2013.01); *H01L 21/266* (2013.01); *H01L 21/31116* (2013.01); *H01L 21/31144* (2013.01); *H01L 21/32136* (2013.01); *H01L 21/32139* (2013.01); *H10D 30/0227* (2025.01); *H10D 30/601* (2025.01); *H10D 64/01* (2025.01); *H10D 64/017* (2025.01); *H10D 64/021* (2025.01); *H10D 84/017* (2025.01); *H10D 84/0172* (2025.01); *H10D 84/038* (2025.01); *H10D 84/85* (2025.01); *H10B 10/12* (2023.02)

(58) Field of Classification Search
CPC ......... H01L 21/31116; H01L 21/31144; H01L 21/32136; H01L 21/32139; H01L 21/823814; H01L 21/823828; H01L 27/092; H01L 29/401; H01L 29/66545; H01L 29/6656; H01L 29/6659; H01L 29/7833; H01L 21/823864; H01L 21/823437; H01L 21/823418; H01L 27/088; H01L 29/0843; H10B 10/12; H10D 62/151; H10D 30/0227; H10D 30/601; H10D 64/01; H10D 64/017; H10D 64/021; H10D 84/017; H10D 84/0172; H10D 84/038; H10D 84/85; H10D 84/0184; H10D 62/149; H10D 84/013; H10D 84/0135; H10D 84/83
See application file for complete search history.

(56) References Cited

U.S. PATENT DOCUMENTS

| | | |
|---|---|---|
| 6,008,077 A | 12/1999 | Maeda |
| 6,063,547 A | 5/2000 | Ye et al. |
| 6,225,151 B1 | 5/2001 | Gardner et al. |
| 6,596,599 B1 | 7/2003 | Guo |
| 6,794,279 B1 | 9/2004 | Stephen et al. |
| 10,840,333 B2 | 11/2020 | Wu et al. |
| 11,575,008 B2 | 2/2023 | Wu et al. |
| 2007/0290192 A1* | 12/2007 | Rotondaro ...... H01L 21/823412 257/19 |
| 2014/0246696 A1* | 9/2014 | Flachowsky ........ H01L 29/6659 257/190 |

OTHER PUBLICATIONS

U.S. Appl. No. 62/753,152 Specification.*
Tian-I Liou, et al., "Hot-ELectron-Induced Degradation of Conventional, Minimum Overlap, LDD and DDD N-Channel MOSFETs", JIEEE Circuits and Devices Magazine, Mar. 1988, pp. 9-15.

* cited by examiner

SEMICONDUCTOR ARRANGEMENT INCLUDING FIRST AND SECOND GATE ELECTRODES AND METHOD OF MANUFACTURE

RELATED APPLICATIONS

This application is a continuation of and claims priority to U.S. patent application Ser. No. 18/106,001, titled "SEMICONDUCTOR ARRANGEMENT AND METHOD OF MANUFACTURE" and filed on Feb. 6, 2023, which is a continuation of and claims priority to U.S. patent application Ser. No. 17/098,751, titled "SEMICONDUCTOR ARRANGEMENT AND METHOD OF MANUFACTURE" and filed on Nov. 16, 2020, which is a continuation of and claims priority to U.S. patent application Ser. No. 16/371,535, titled "SEMICONDUCTOR ARRANGEMENT AND METHOD OF MANUFACTURE" and filed on Apr. 1, 2019, which claims priority to U.S. Provisional Application 62/753,152, titled "SEMICONDUCTOR ARRANGEMENT AND METHOD OF MANUFACTURE" and filed on Oct. 31, 2018. U.S. patent application Ser. No. 18/106,001, U.S. patent application Ser. No. 17/098,751, U.S. patent application Ser. No. 16/371,535, and U.S. Provisional Application 62/753,152 are incorporated herein by reference.

BACKGROUND

In a semiconductor device, such as a transistor, current flows through a channel region between a source region and a drain region upon application of a sufficient voltage or bias to a gate of the device. The gate is isolated from the channel region by a gate dielectric layer. When current flows through the channel region, the device is generally regarded as being in an 'on' state, and when current is not flowing through the channel region, the device is generally regarded as being in an 'off' state. As technology nodes shrink, in some integrated circuit designs, the gate structure height and width dimensions also shrink. Low doped drain (LDD) regions defined in the source/drain regions reduce the likelihood of hot carrier injection that may potentially damage the gate dielectric layer as the height and width dimensions shrink.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
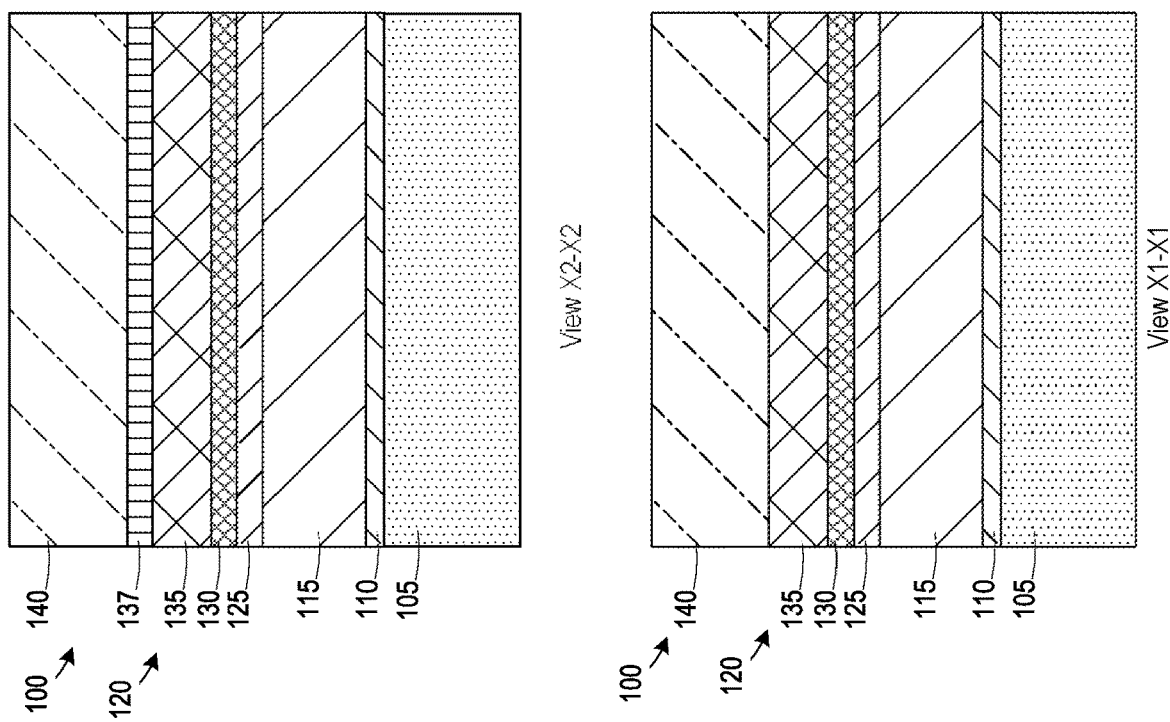
FIGS. 1-16 are illustrations of a semiconductor arrangement at various stages of fabrication, in accordance with some embodiments.
Figure 1:
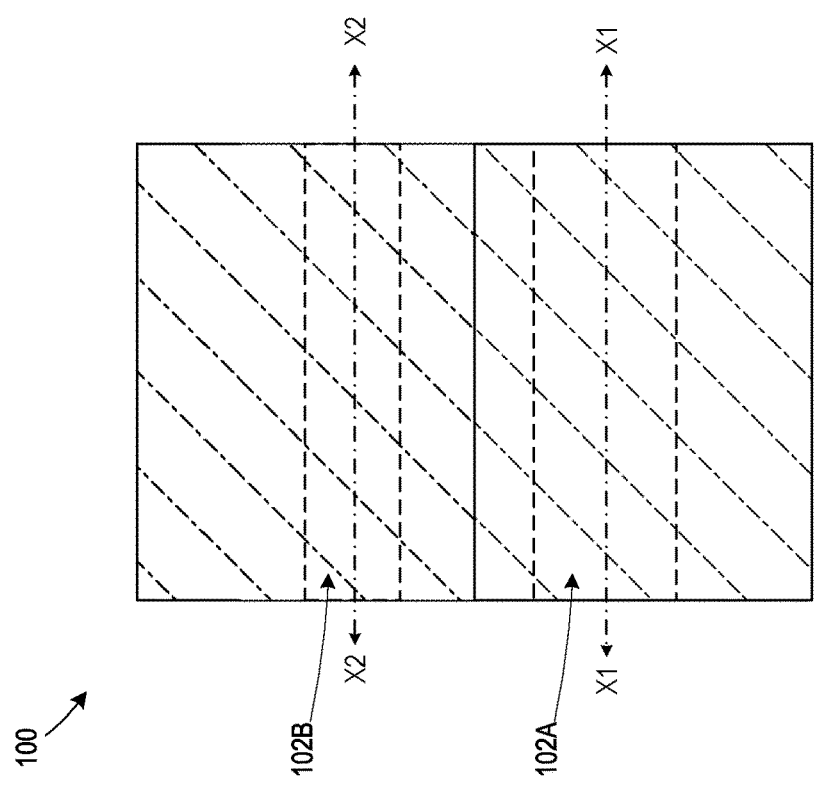

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. In some embodiments, the semiconductor arrangement comprises a transistor. In some embodiments, an etch process for forming a gate structure and an implantation process for forming a doped region adjacent the gate structure are performed using a patterned mask stack. In some embodiments, a sidewall spacer is formed adjacent the gate structure, and a second dopant is implanted using the first sidewall spacer and the first gate structure as an implantation template to form a second doped region in the semiconductor layer. In some embodiments, a depth of the first doped region is lower than a depth of the second doped region relative to a top surface of the semiconductor layer.

Turning to FIG. 1, a plurality of layers used in the formation of a semiconductor arrangement 100 are illustrated, in accordance with some embodiments. FIG. 1 includes a plan view showing where various cross-sectional views are taken. Referring to FIG. 1, the view X1-X1 is a cross-sectional view taken through the semiconductor arrangement 100 in a direction corresponding to a gate length direction through a first active region 102A, and the view X2-X2 is a cross-sectional view taken through the semiconductor arrangement 100 in a direction corresponding to a gate length direction through a second active region 102B. Not all aspects of the processing shown in the cross-sectional views will be depicted in the plan view.

In some embodiments, the semiconductor arrangement 100 comprises transistors. The plurality of layers is formed over a semiconductor layer 105. In some embodiments, the semiconductor layer 105 is part of a substrate comprising at least one of an epitaxial layer, a single crystalline semiconductor material such as, but not limited to, Si, Ge, SiGe, InGaAs, GaAs, InSb, GaP, GaSb, InAlAs, GaSbP, GaAsSb, and InP, a silicon-on-insulator (SOI) structure, a wafer, or a die formed from a wafer. In some embodiments, the semiconductor layer 105 comprises crystalline silicon. In some embodiments, well regions are formed in the semiconductor layer 105 to define the first active region 102A and the second active region 102B. In some embodiments, the well regions are of different conductivity types. It will be appreciated that in the cross-sectional views, the well regions are not shown to simplifier the drawings.

In some embodiments, a gate dielectric layer 110 is formed over the semiconductor layer 105. In some embodiments, the gate dielectric layer 110 comprises silicon and oxygen. According to some embodiments, the gate dielectric layer 110 is formed by at least one of thermal oxidation, chemical oxidation, chemical vapor deposition (CVD), including low pressure CVD (LPCVD), plasma enhanced CVD (PECVD), ultra-high vacuum CVD (UHVCVD), reduced pressure CVD (RPCVD), atomic layer deposition (ALD), physical vapor deposition, pulsed laser deposition, sputtering, evaporative deposition, vapor phase epitaxy (VPE), molecular beam epitaxy (MBE), liquid phase epitaxy (LPE), or other applicable techniques.

In some embodiments, a gate electrode layer 115 is formed over the gate dielectric layer 110 by at least one of CVD, LPCVD, PECVD, UHVCVD, RPCVD, ALD, physical vapor deposition, pulsed laser deposition, sputtering, evaporative deposition, VPE, MBE, LPE, or other applicable techniques. In some embodiments, the gate electrode layer 115 comprises polysilicon.

In some embodiments, a first mask layer 120 is formed over the gate electrode layer 115. According to some embodiments, the first mask layer 120 comprises a plurality of individually formed layers that together define a first mask stack. In some embodiments, the first mask layer 120 comprises a hard mask layer 125 formed over the gate electrode layer 115 by at least one of CVD, LPCVD, PECVD, UHVCVD, RPCVD, ALD, physical vapor deposition, pulsed laser deposition, sputtering, evaporative deposition, VPE, MBE, LPE, or other applicable techniques. In some embodiments, the hard mask layer 125 comprises silicon and nitrogen.

In some embodiments, the first mask layer 120 comprises a bottom antireflective coating (BARC) layer 130 formed over the hard mask layer 125. In some embodiments, the BARC layer 130 is a polymer layer that is applied using a spin coating process. In some embodiments, an organic planarization layer (OPL) 135 is formed over the BARC layer 130. In some embodiments, the OPL layer 135 comprises a photo-sensitive organic polymer that is applied using a spin coating process. In some embodiments, the OPL layer 135 comprises a dielectric layer.

In some embodiments, the first mask layer 120 comprises a second hard mask layer 137 formed over a region of the semiconductor arrangement 100 comprising the second active region 102B while not being formed over the first active region 102A. In some embodiments, the second hard mask layer 137 is formed over the first active region 102A and the second active region 102B, a mask layer is formed over the second active region 102B, an etch process is performed to remove the second hard mask layer 137 over the first active region 102A, and then the mask layer formed over the second active region 102B is removed.

According to some embodiments, the first mask layer 120 comprises a photoresist layer 140 formed over the OPL layer 135 and the second hard mask layer 137. In some embodiments, the photoresist layer 140 is formed by at least one of spinning, spray coating, or other applicable techniques. The photoresist layer 140 comprises an electromagnetic radiation sensitive material and properties, such as solubility, of the photoresist layer 140 are affected by electromagnetic radiation. The photoresist layer 140 is either a negative photoresist or a positive photoresist. In some embodiments, portions of the OPL layer 135 are irradiated by the electromagnetic radiation that patterns the photoresist layer 140 are affected to change the etch selectivity of the irradiated portions of the OPL layer 135 with respect to non-irradiated portions.

Figure 2:
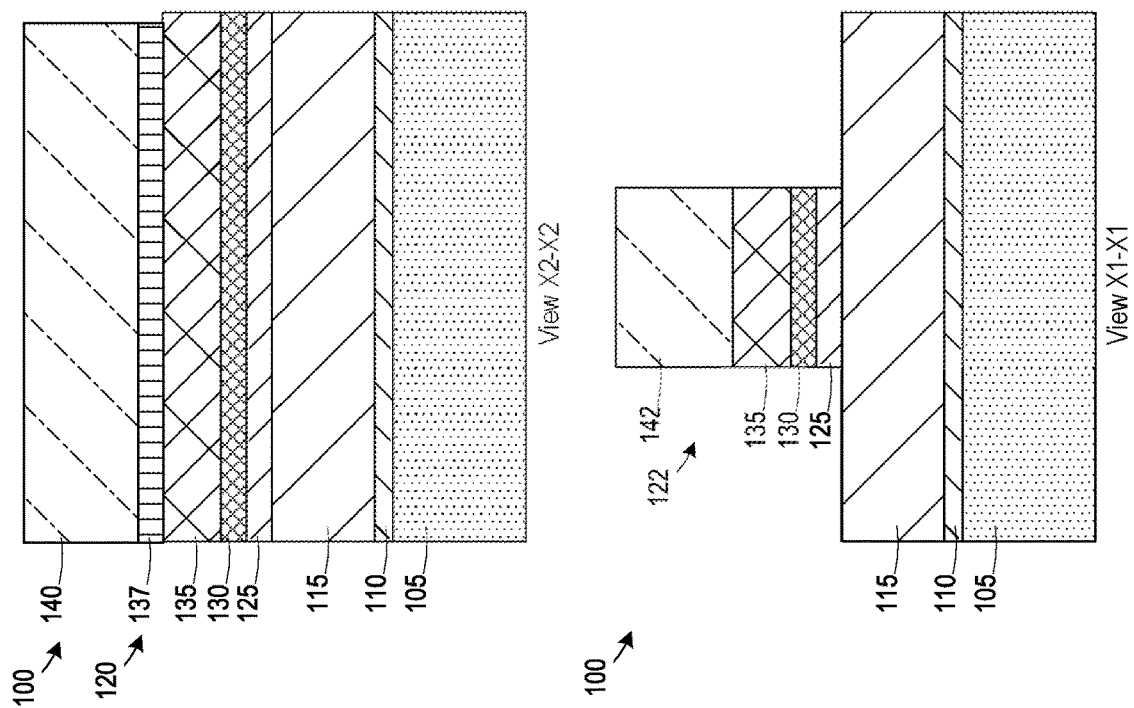
Figure 2:
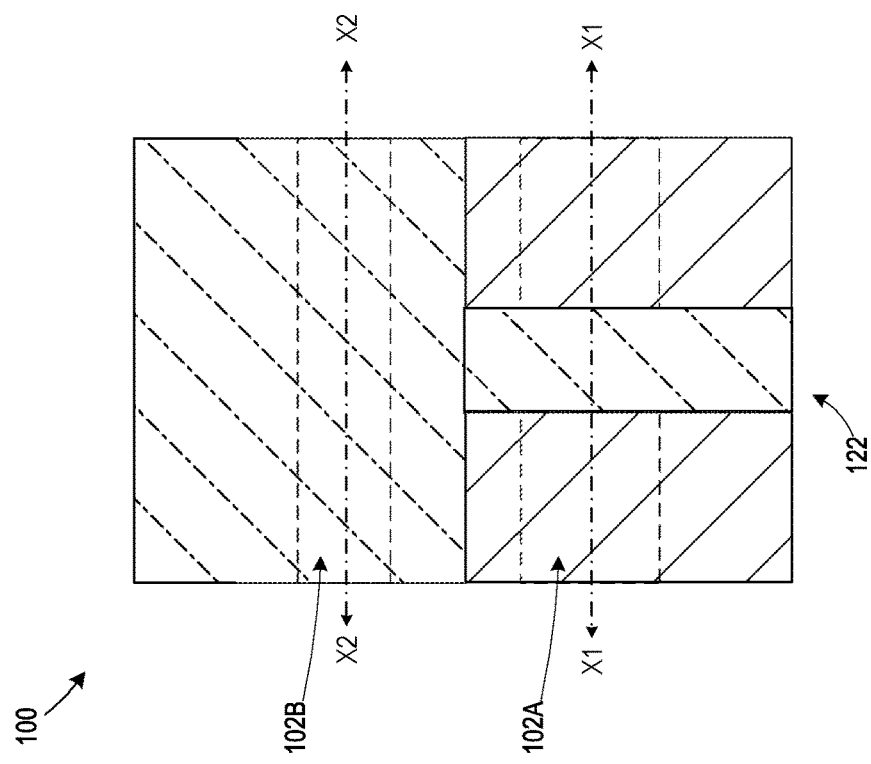

Referring to FIG. 2, the first mask layer 120 is patterned to define a first gate mask 122, in accordance with some embodiments. In some embodiments, the photoresist layer 140 is exposed using a radiation source and a reticle to define a pattern in the photoresist layer 140. In some embodiments, portions of the photoresist layer 140 are removed to define a patterned photoresist layer 142. In some embodiments, the underlying OPL layer 135, BARC layer 130, and hard mask layer 125 are etched using the patterned photoresist layer 142 as a template to form the first gate mask 122 and expose portions of the gate electrode layer 115 adjacent the first gate mask 122. In some embodiments, the photoresist layer 140 remains intact over the second active region 102B, so as to isolate the processing of the second active region 102B from that of the first active region 102A.

Figure 3:
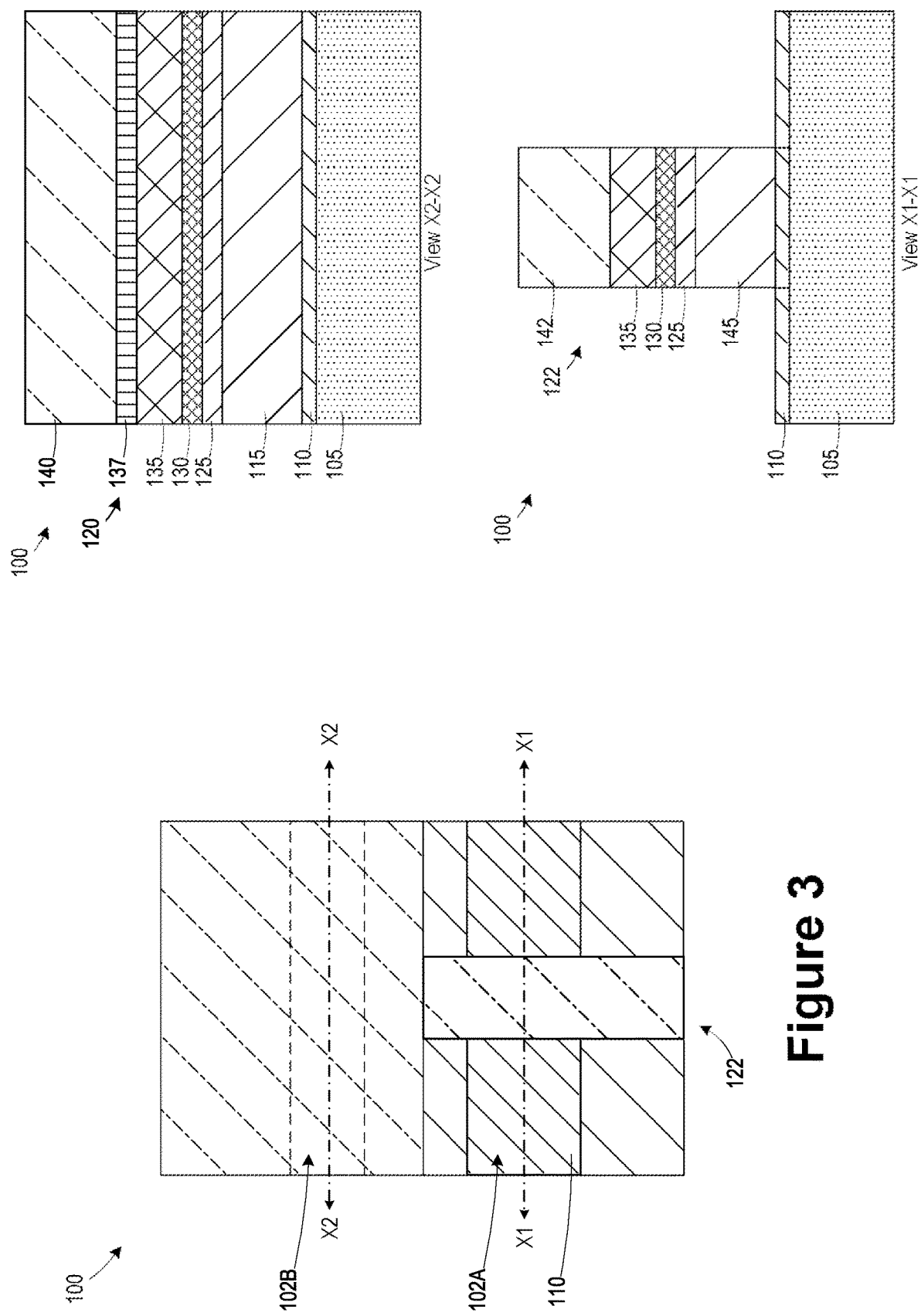

Referring to FIG. 3, an etching processes is performed to pattern the gate electrode layer 115 over the first active region 102A using the first gate mask 122 as an etch template to define a first gate electrode 145 over the first active region 102A, in accordance with some embodiments. In some embodiments, the etching process is at least one of a plasma etching process, a reactive ion etching (RIE) process, or other applicable techniques. In some embodiments, the gate dielectric layer 110 is not etched when etching the gate electrode layer 115. In some embodiments, the etching process also patterns the gate dielectric layer 110 as indicated by the dashed lines. In some embodiments, the chemistry of the etching process may be changed from a first etch chemistry for etching the gate electrode layer 115 and a second etch chemistry for etching the gate dielectric layer 110.

Figure 4:
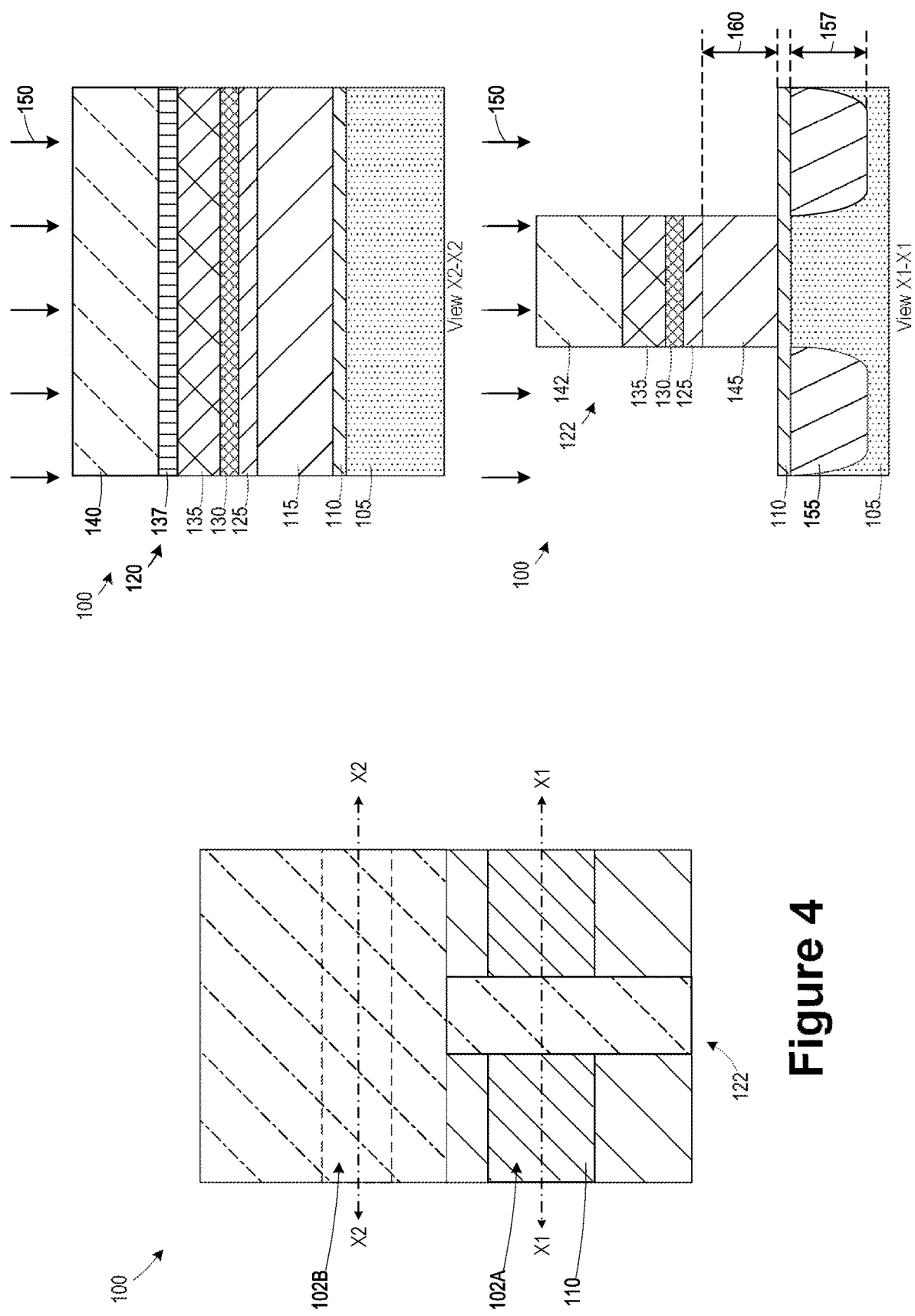

Referring to FIG. 4, an implantation process 150 is performed using the first gate mask 122 as an implantation template to implant a first dopant into the first active region 102A of the semiconductor layer 105 and form a first doped region 155 in the semiconductor layer 105 in the first active region 102A, in accordance with some embodiments. In some embodiments, the first doped region 155 is a lightly doped drain (LDD) region having a first dopant concentration. In some embodiments, the first doped region 155 has a depth 157 greater than a height 160 of the first gate electrode 145 as measured from a top surface of the semiconductor layer 105. Using the first gate mask 122 as the implantation template allows the first doped region 155 to be formed with a greater depth 157 without introducing dopant into the gate dielectric layer 110, which can mitigate hot carrier injection and thereby improve hot carrier injection performance issues. In some embodiments, the greater depth 157 of the first doped region 155 results from the use of a higher implantation energy. The use of the first gate mask 122 as an implantation template allows a complete retrograde junction to be formed due to the higher implantation energy. In some embodiments, the implantation process 150 is a vertical implantation process. Compared to angled implantation processes for forming LDD regions, the use of a vertical implantation process reduces threshold voltage mismatches. In some embodiments, the first mask layer 120 in place over the second active region 102B isolates the second active region 102B from the implantation process 150.

In some embodiments, such as where the resulting transistor is an n-type metal-oxide-semiconductor (nMOS) device, the first doped region 155 comprises an n-type impurity, such as phosphorous, arsenic, or a different n-type dopant. In some embodiments, such as where the resulting transistor is a p-type metal-oxide-semiconductor (pMOS) device, the first doped region 155 comprises a p-type impurity such as boron, $BF_2$, or a different p-type dopant. In some embodiments, the implantation process 150 is performed through the gate dielectric layer 110 to protect an upper surface of the semiconductor layer 105 from implantation damage.

Figure 5:
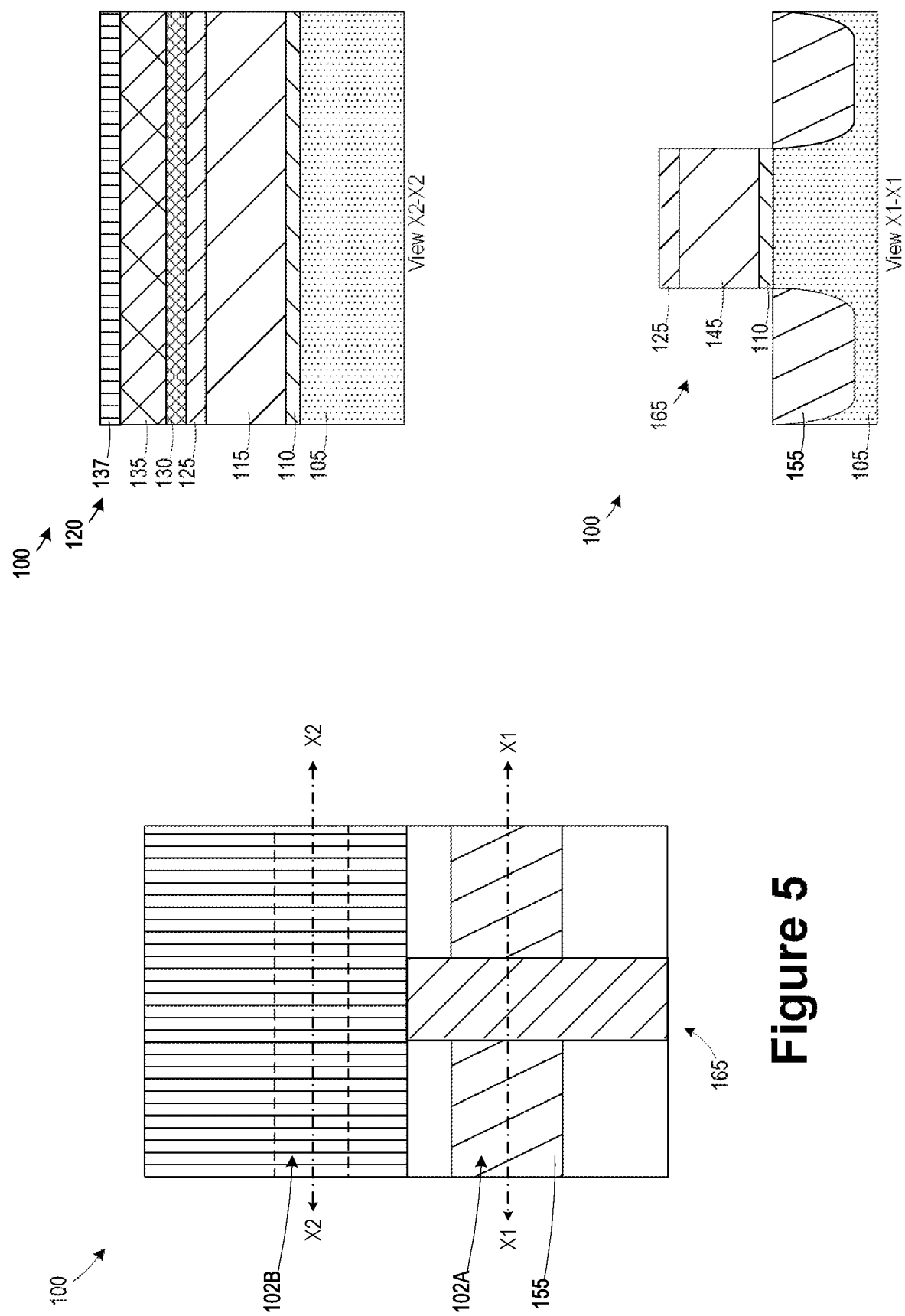

Referring to FIG. 5, an etch process is performed to remove exposed portions of the gate dielectric layer 110 and removal processes, such as ashing, etching, etc., are performed to remove the photoresist layer 140 from over the second active region 102B and to remove the patterned photoresist layer 142, the OPL layer 135, and the BARC layer 130 from over the first active region 102A, in accordance with some embodiments. The first gate electrode 145 and the remaining portion of the gate dielectric layer 110 define a first gate structure 165. In some embodiments, the first gate structure 165 is a sacrificial, or "dummy" gate structure, which is later removed and replaced with a replacement gate structure comprising a high-k gate dielectric layer and a metal gate electrode.

Figure 6:
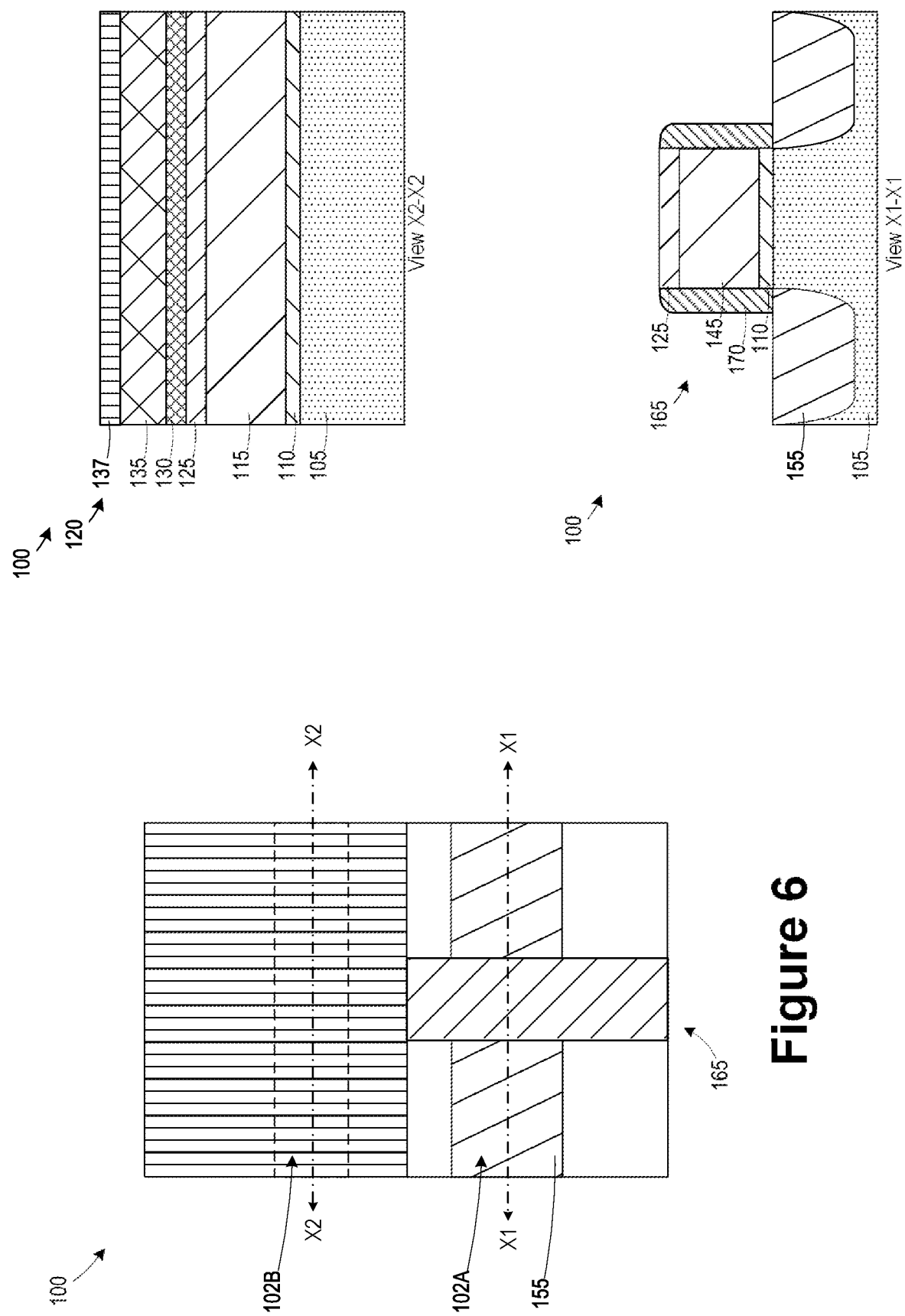

Referring to FIG. 6, a sidewall spacer 170 is formed adjacent the first gate structure 165, in accordance with some embodiments. In some embodiments, the sidewall spacer 170 is formed by depositing a conformal spacer layer over the first gate structure 165 and performing an anisotropic etch process to remove portions of the spacer layer positioned on horizontal surfaces of the hard mask layer 125 and the semiconductor layer 105. In some embodiments, the sidewall spacer 170 comprises the same material as the hard mask layer. In some embodiments, the sidewall spacer 170 comprises nitrogen and silicon. For ease of illustration and to avoid obscuring the first doped region 155, the sidewall spacer 170 is not illustrated in the plan view.

Figure 7:
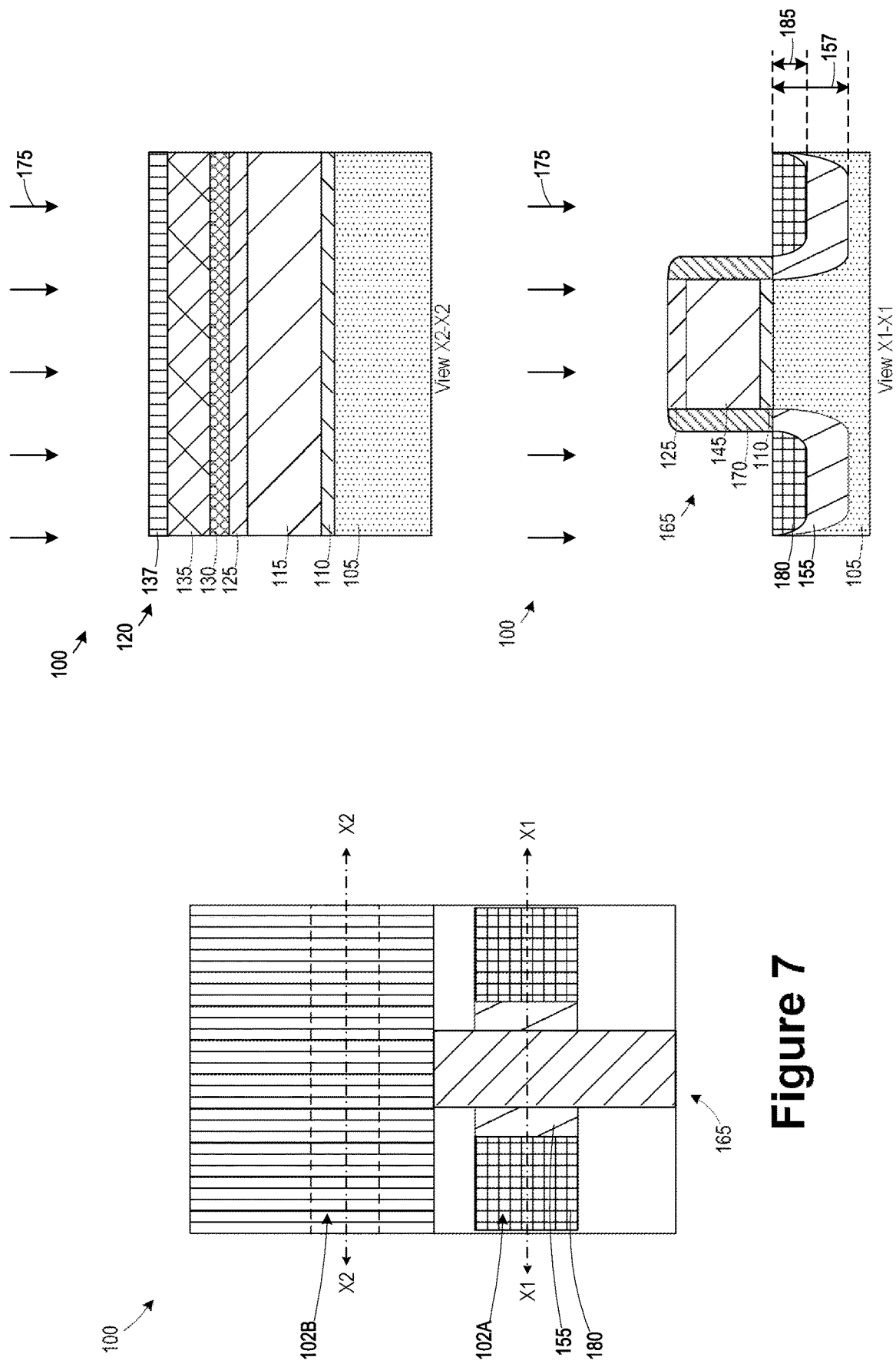

Referring to FIG. 7, an implantation process 175 is performed using the first gate structure 165 and the sidewall spacer 170 as an implantation template to implant a second dopant into the semiconductor layer 105 and form a second doped region 180 in the first active region 102A of the semiconductor layer 105, in accordance with some embodiments. In some embodiments, the second doped region 180 is formed within the first doped region 155 such that the first doped region 155 surrounds the second doped region 180. In some embodiments, the second doped region 180 is a highly doped source/drain (S/D) region having a second dopant concentration greater than the first dopant concentration of the first doped region 155. In some embodiments, the second doped region 180 has a depth 185 less than the depth 157 of the first doped region 155 as measured from a top surface of the semiconductor layer 105. In some embodiments, the first dopant and the second dopant are the same. In some embodiments, the first mask layer 120 in place over the second active region 102B isolates the second active region 102B from the implantation process 175.

Figure 8:
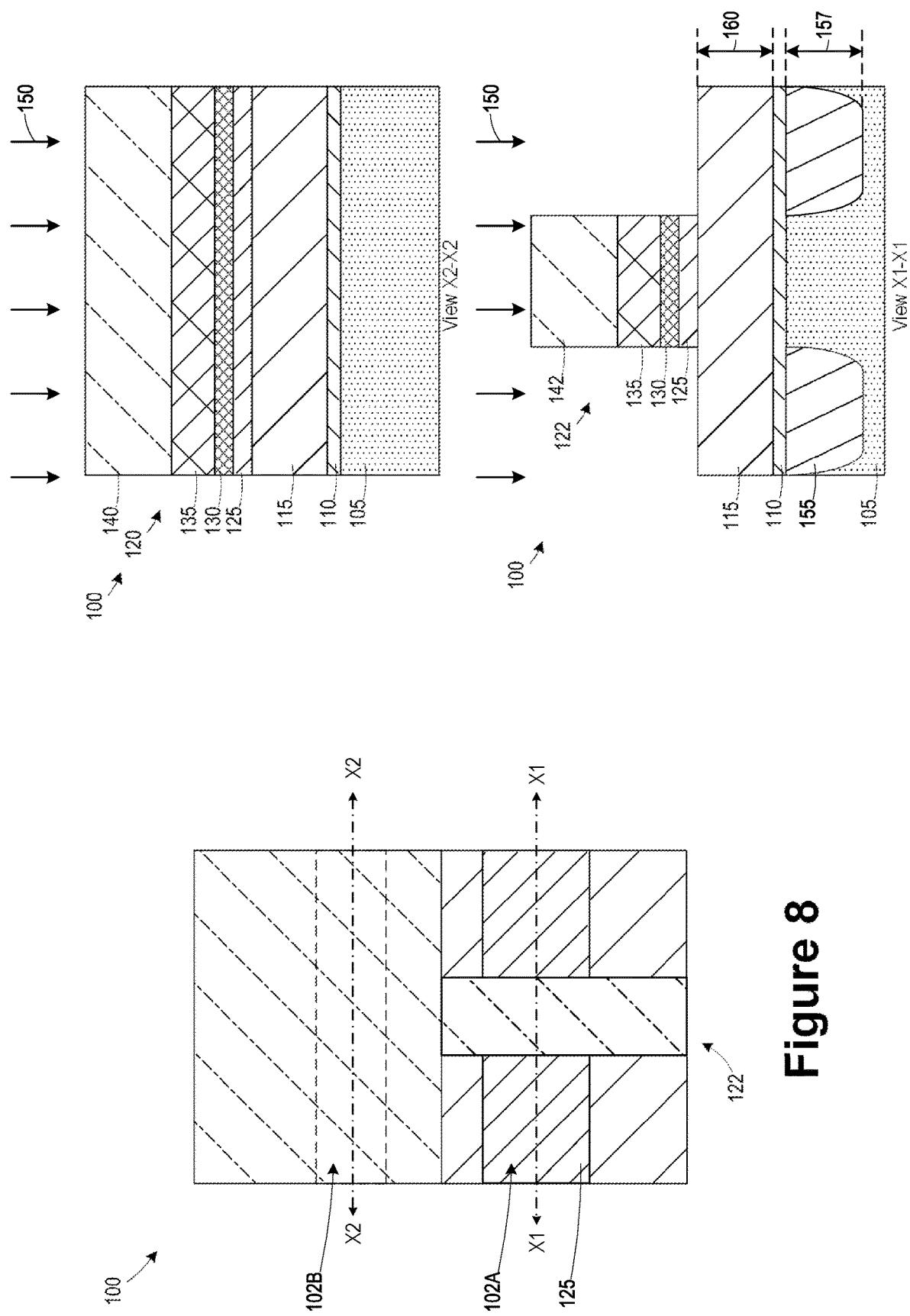

Turning to FIG. 8, in some embodiments, the implantation process 150 to form the first doped region 155, as described with respect to FIG. 4, is performed prior to etching the gate electrode layer 115, as described with respect to FIG. 3. During the implantation process 150 dopant is introduced into the semiconductor layer 105 through the portions of the gate electrode layer 115 and the gate dielectric layer 110 not covered by the first gate mask 122. In some embodiments, the energy of the implantation process 150 is configured to account for the presence of the gate electrode layer 115 and the gate dielectric layer 110. In some embodiments, the first doped region 155 has a depth 157 greater than a height 160 of the first gate electrode 145. Using the first gate mask 122 as the implantation template allows the first doped region 155 to be formed with a greater depth 157 without introducing dopant into the gate dielectric layer 110, which can lead to hot carrier injection performance issues. In some embodiments, the first mask layer 120 in place over the second active region 102B isolates the second active region 102B from the implantation process 150.

Figure 9:
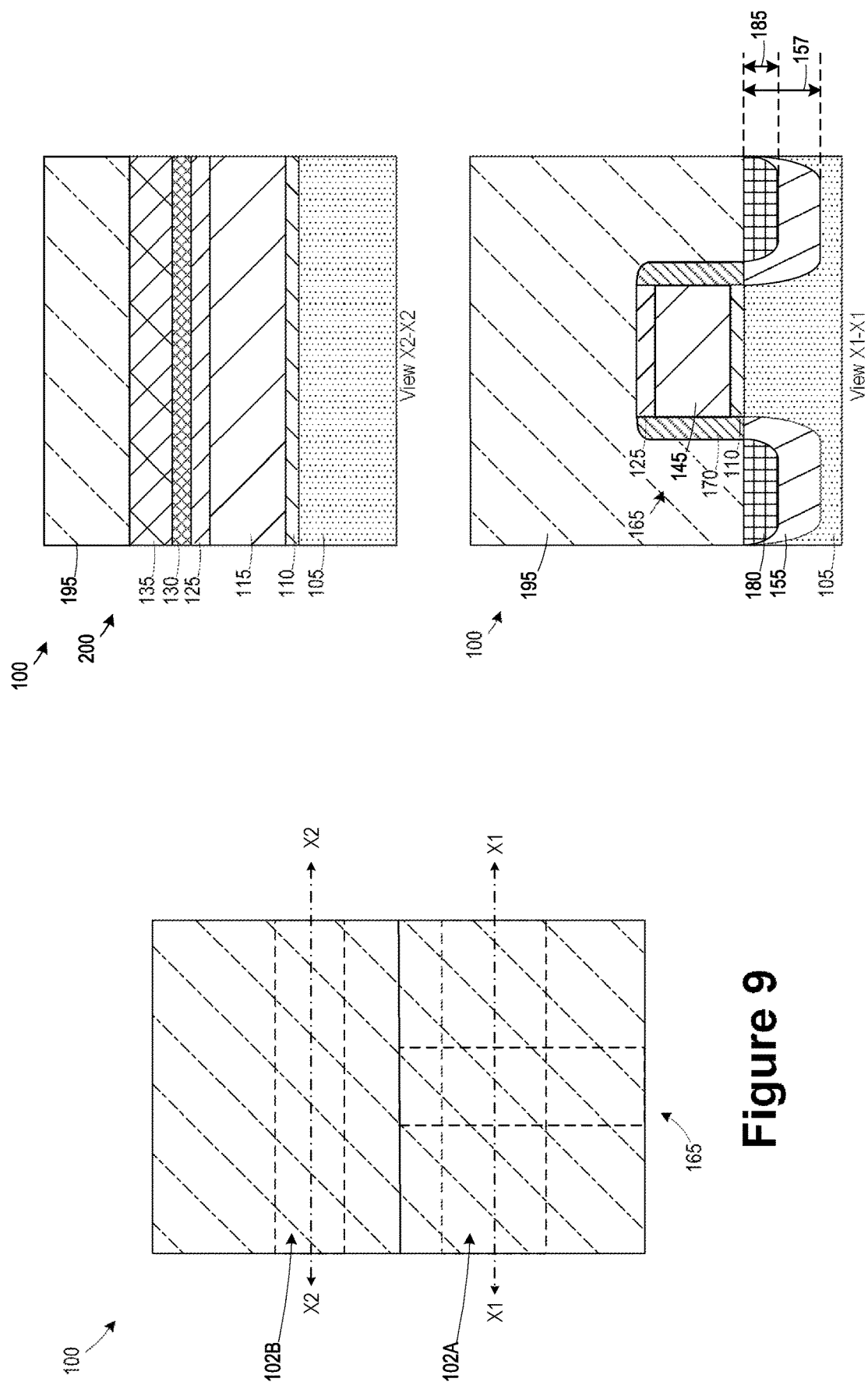

Referring to FIG. 9, the second hard mask layer 137 is removed from over the second active region 102B and a photoresist layer 195 is formed over the semiconductor arrangement 100 after the implantation process 175 regardless of whether the first doped region 155 is formed prior to the etching of the gate electrode layer 115, as described with respect to FIG. 8, or after the etching of the gate electrode layer 115, as described with respect to FIG. 4. In some embodiments, an etch process is performed to remove the second hard mask layer 137. In some embodiments, the combination of one or more of the photoresist layer 195, the OPL layer 135, the BARC layer 130, and the hard mask layer 125 formed over the second active region 102B may be referred to as a second mask layer 200.

Figure 10:
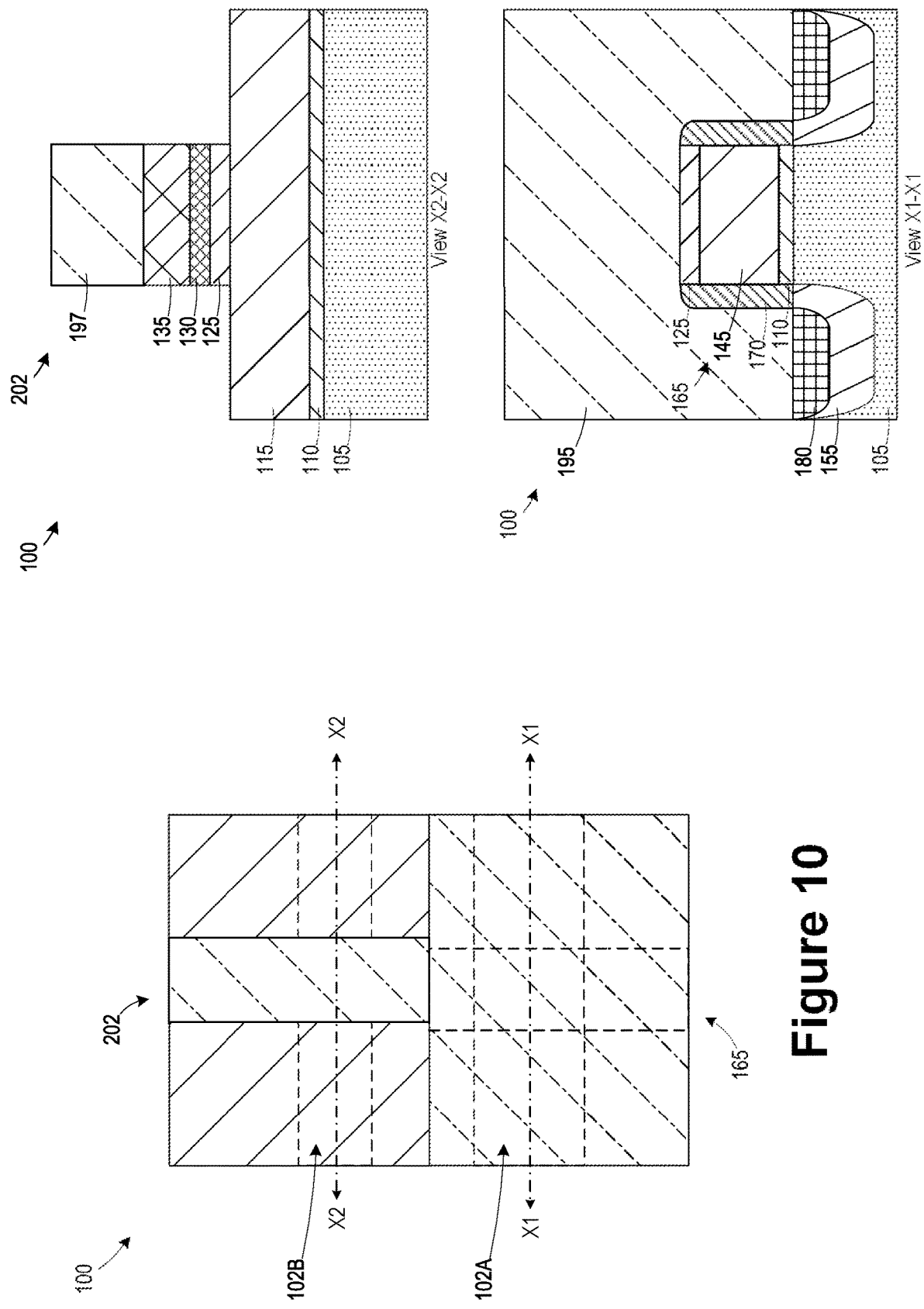

Referring to FIG. 10, the second mask layer 200 is patterned to define a second gate mask 202, in accordance with some embodiments. In some embodiments, the photoresist layer 195 is exposed using a radiation source and a reticle to define a pattern in the photoresist layer 195. In some embodiments, portions of the photoresist layer 195 are removed to define a patterned photoresist layer 197. In some embodiments, the underlying OPL layer 135, BARC layer 130, and hard mask layer 125 are etched using the patterned photoresist layer 197 as a template to form the second gate mask 202 and expose portions of the gate electrode layer 115 adjacent the second gate mask 202. In some embodiments, the photoresist layer 195 remains intact over the first active region 102A, so as to isolate the processing of the second active region 102B from that of the first active region 102A.

In some embodiments, due to manufacturing tolerances, the second gate mask 202 overlying the second active region 102B is not perfectly aligned with the first gate structure 165 overlying the first active region 10A, where a perfect alignment would result in a first sidewall of the second gate mask 202 being co-planar with a first sidewall of the first gate electrode 145 and a second sidewall of the second gate mask 202 being co-planar with a second sidewall of the first gate electrode 145. Thus, in some embodiments, there is misalignment between the second gate mask 202 and the first gate electrode 145, such that the sidewalls of the second gate mask 202 are not co-planar with the sidewalls of the first gate electrode 145. As will be described further with respect to FIG. 17, in some embodiments, this misalignment between the second gate mask 202 and the first gate electrode 145 results in alignment variation between the first gate structure 165 and a second gate structure 810B, which is formed using the second gate mask 202.

Figure 11:
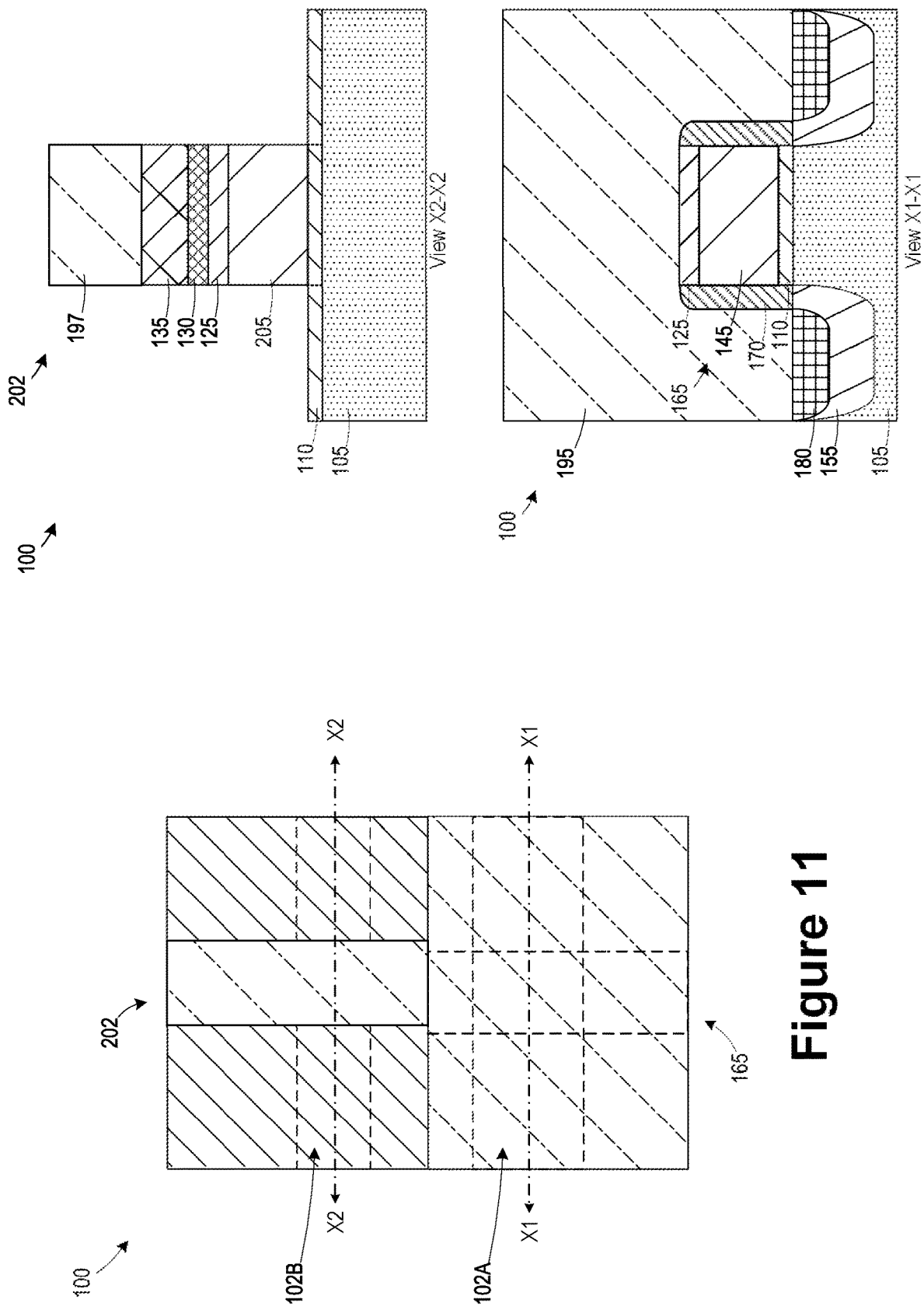

Referring to FIG. 11, an etching processes is performed to pattern the gate electrode layer 115 over the second active region 102B using the second gate mask 202 as an etch template to define a second gate electrode 205 over the second active region 102B, in accordance with some embodiments. In some embodiments, the etching process is at least one of a plasma etching process, a reactive ion etching (RIE) process, or other applicable techniques. In some embodiments, the gate dielectric layer 110 is not etched when etching the gate electrode layer 115. In some embodiments, the etching process also patterns the gate dielectric layer 110 as indicated by the dashed lines. In some embodiments, the chemistry of the etching process may be changed from a first etch chemistry for etching the gate electrode layer 115 and a second etch chemistry for etching the gate dielectric layer 110.

Figure 12:
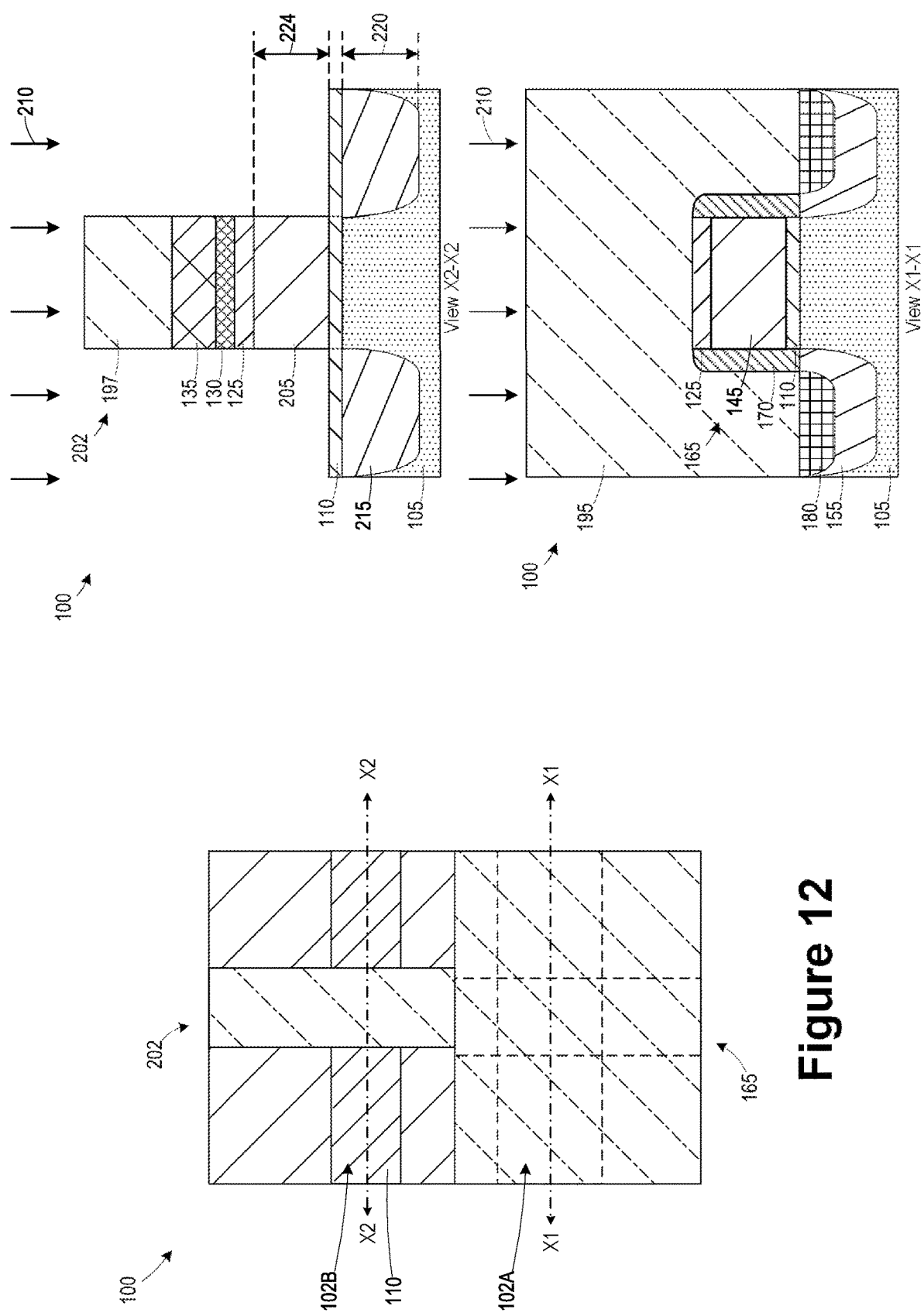

Referring to FIG. 12, an implantation process 210 is performed using the second gate mask 202 as an implantation template to implant a third dopant into the second active region 102B of the semiconductor layer 105 and form a third doped region 215 in the semiconductor layer 105 in the second active region 102B, in accordance with some embodiments. In some embodiments, the third doped region 215 is a lightly doped drain (LDD) region having a third dopant concentration. In some embodiments, the third doped region 215 has a depth 220 greater than a height 224 of the second gate electrode 205 as measured from a top surface of the semiconductor layer 105. Using the second gate mask 202 as the implantation template allows the third doped region 215 to be formed with a greater depth 220 without introducing dopant into the gate dielectric layer 110, which can mitigate hot carrier injection and thereby improve hot carrier injection performance issues. In some embodiments, the greater depth 220 of the third doped region 215 results from the use of a higher implantation energy. The use of the second gate mask 202 as an implantation template allows a complete retrograde junction to be formed due to the higher implantation energy. In some embodiments, the implantation process 210 is a vertical implantation process. Compared to angled implantation processes for forming LDD regions, the use of a vertical implantation process reduces threshold voltage mismatches. In some embodiments, the photoresist layer 195 in place over the first active region 102A isolates the first active region 102A from the implantation process 210.

In some embodiments, such as where the resulting transistor is an n-type metal-oxide-semiconductor (nMOS) device, the third doped region 215 comprises an n-type impurity, such as phosphorous, arsenic, or a different n-type dopant. In some embodiments, such as where the resulting transistor is a p-type metal-oxide-semiconductor (pMOS) device, the third doped region 215 comprises a p-type impurity such as boron, $BF_2$, or a different p-type dopant. In some embodiments, the implantation process 210 is performed through the gate dielectric layer 110 to protect an upper surface of the semiconductor layer 105 from implantation damage. In some embodiments, when the first doped region 155 comprises a p-type dopant, the third doped region 215 comprises an n-typed dopant. In some embodiments, when the first doped region 155 comprises an n-type dopant, the third doped region 215 comprises a p-typed dopant.

Figure 13:
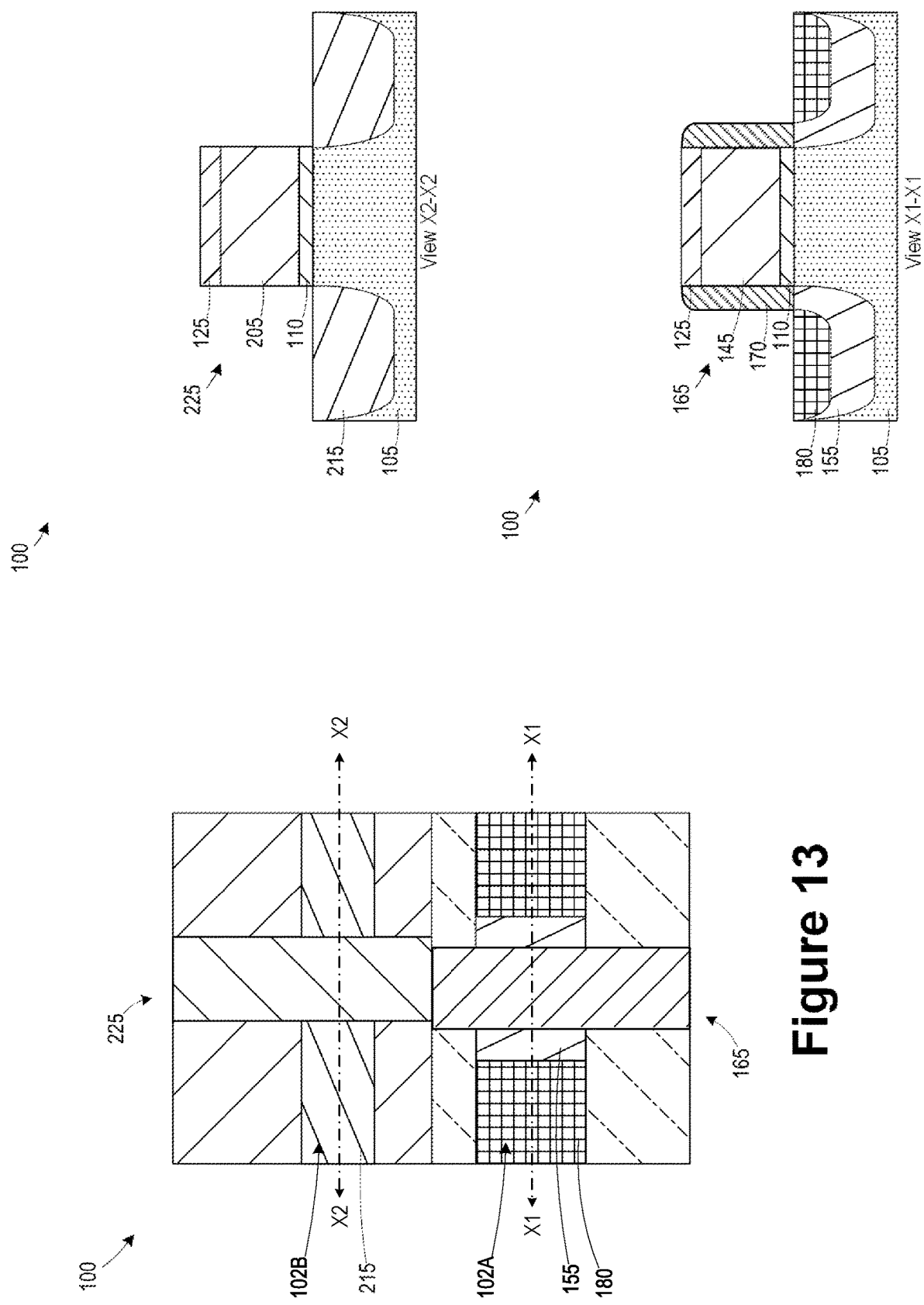

Referring to FIG. 13, an etch process is performed to remove exposed portions of the gate dielectric layer 110 and removal processes, such as ashing, etching, etc., are performed to remove the photoresist layer 195 from over the first active region 102A and to remove the patterned photoresist layer 197, the OPL layer 135, and the BARC layer 130 from over the second active region 102B, in accordance with some embodiments. The second gate electrode 205 and the remaining portion of the gate dielectric layer 110 define a second gate structure 225. In some embodiments, the second gate structure 225 is a sacrificial, or "dummy" gate structure, which is later removed and replaced with a replacement gate structure comprising a high-k gate dielectric layer and a metal gate electrode.

Figure 14:
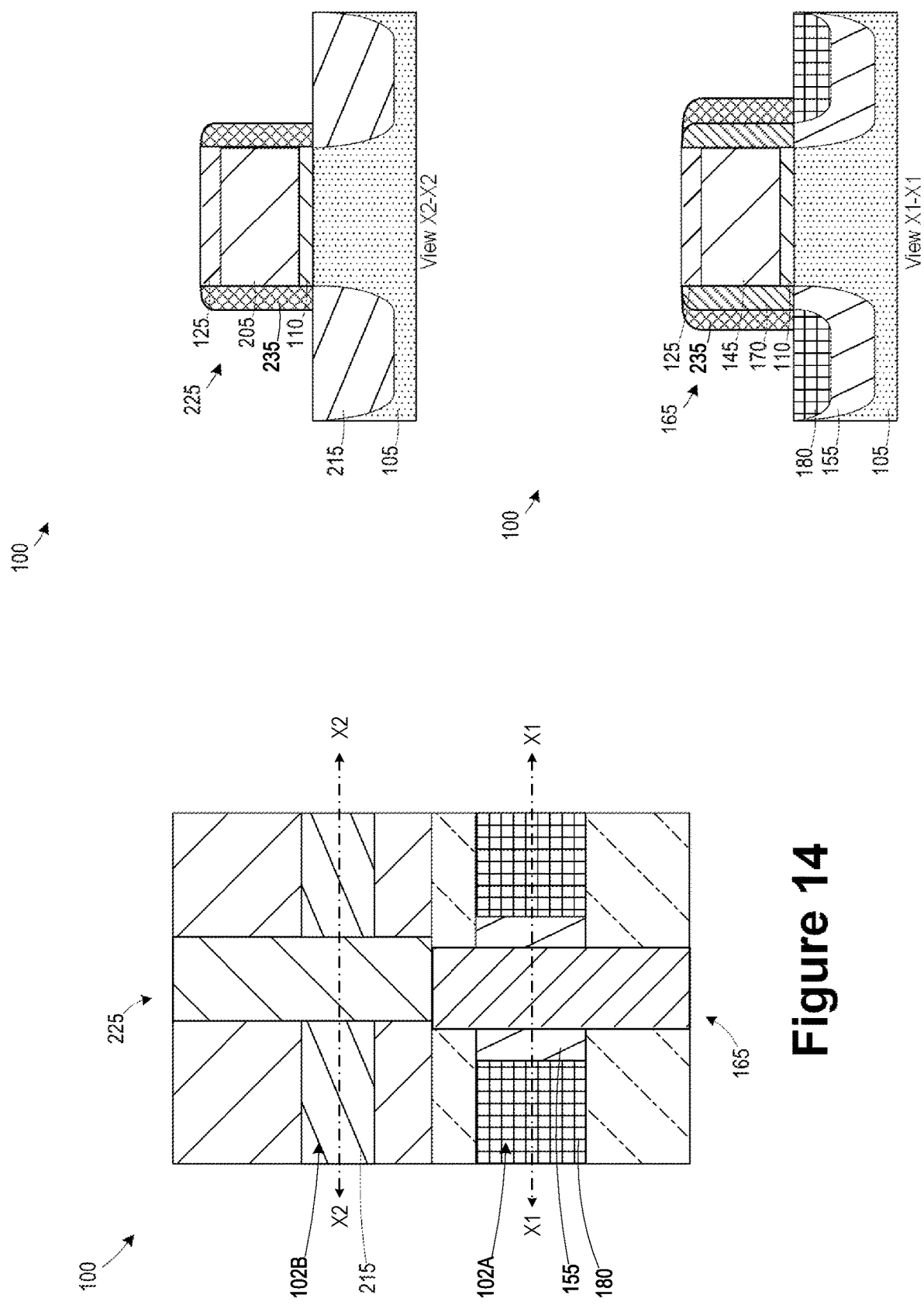

Referring to FIG. 14, a sidewall spacer 235 is formed adjacent the second gate structure 225, in accordance with some embodiments. In some embodiments, the sidewall spacer 235 is formed by depositing a conformal spacer layer over the second gate structure 225 and performing an anisotropic etch process to remove portions of the spacer layer positioned on horizontal surfaces of the hard mask layer 125 and the semiconductor layer 105. In some embodiments, the sidewall spacer 235 comprises the same material as the hard mask layer. In some embodiments, the sidewall spacer 235 comprises nitrogen and silicon. For ease of illustration and to avoid obscuring the third doped region 215, the sidewall spacer 235 is not illustrated in the plan view. In some embodiments, the sidewall spacer 235 is also formed adjacent the first gate structure 165. In some embodiments, the sidewall spacer 235 comprises a different material than the sidewall spacer 170 to allow selective removal of the sidewall spacer 235 adjacent the first gate structure 165 using masking and etching processes.

Figure 15:
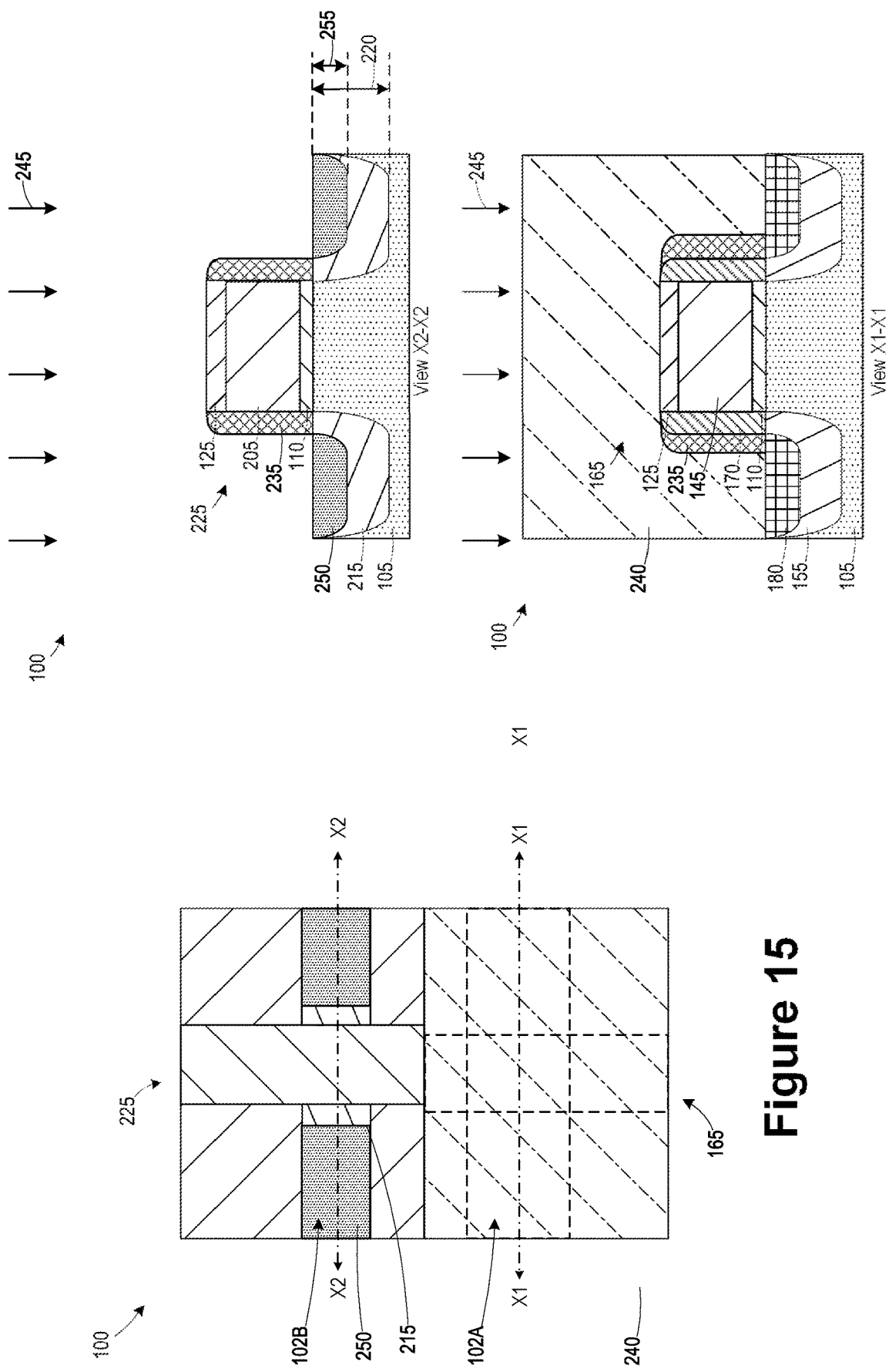

Referring to FIG. 15, a mask layer 240 is formed above the first active region 102A and the first gate structure 165, and an implantation process 245 is performed using the second gate structure 225 and the sidewall spacer 170 as an implantation template to implant a fourth dopant into the semiconductor layer 105 and form a fourth doped region 250 in the second active region 102B of the semiconductor layer 105, in accordance with some embodiments. In some embodiments, the mask layer 240 comprises a photoresist layer. In some embodiments, the fourth doped region 250 is formed within the third doped region 215 such that the third doped region 215 surrounds the fourth doped region 250. In some embodiments, the fourth doped region 250 is a highly doped source/drain (S/D) region having a fourth dopant concentration greater than the third dopant concentration of the third doped region 215. In some embodiments, the fourth doped region 250 has a depth 255 less than the depth 220 of the third doped region 215 as measured from a top surface of the semiconductor layer 105. In some embodiments, the third dopant and the fourth dopant are the same. In some embodiments, the mask layer 240 in place over the first active region 102A isolates the first active region 102A from the implantation process 245.

Figure 16:
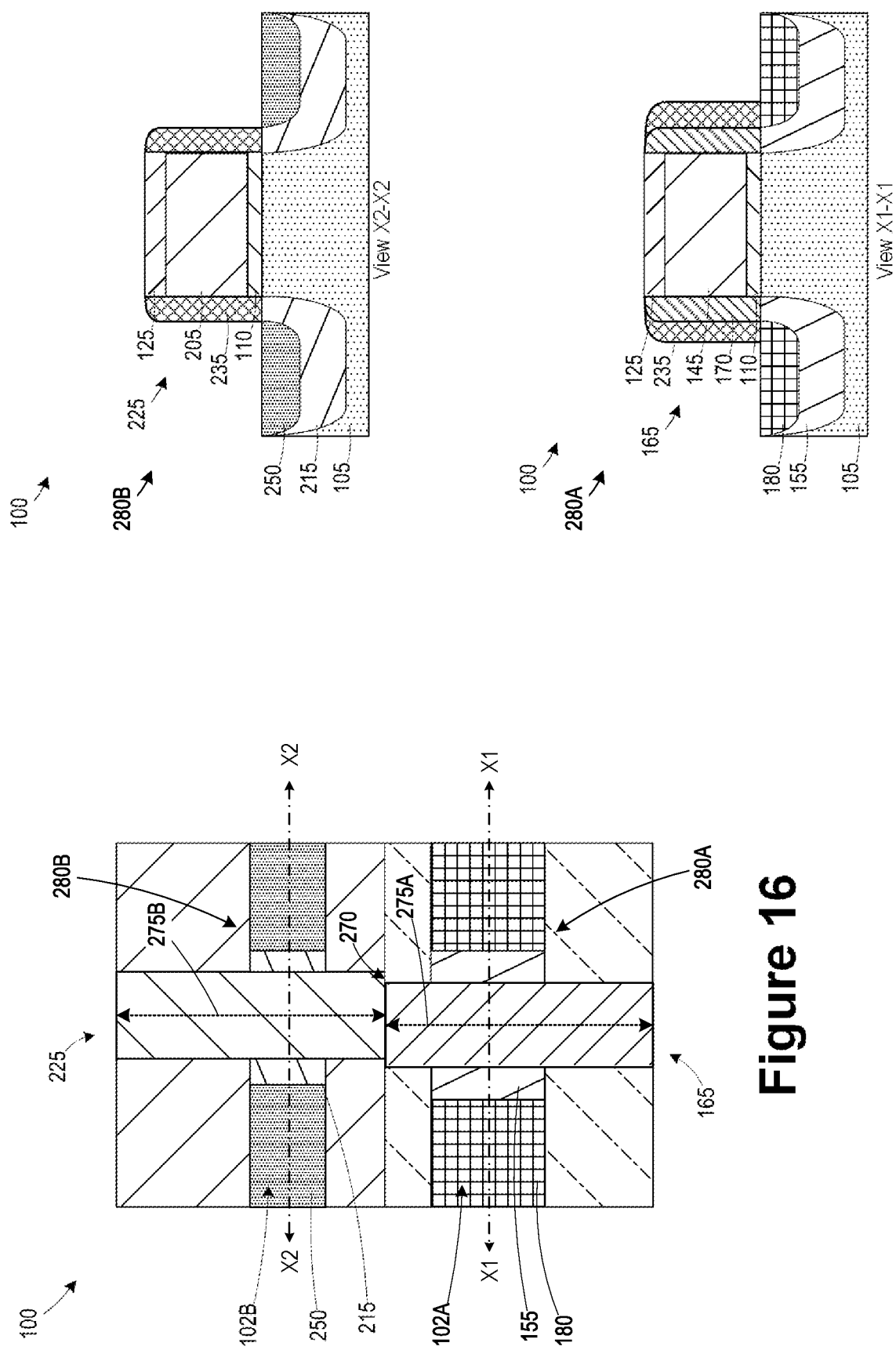

Referring to FIG. 16, the mask layer 240 is removed, in accordance with some embodiments. In some embodiments, an etch process or an ashing process is performed to remove the mask layer 240.

As described herein, the first gate structure 165 and the first doped region 155 are formed prior to forming the second gate structure 225 and the third doped region 215. In some embodiments, the order is reversed, such that the second gate structure 225 and the third doped region 215 are formed first. Since the first gate structure 165 and the second gate structure 225 are formed using separate process flows, an interface 270 is defined where the first gate structure 165 contacts the second gate structure 225. In some embodiments, the interface 270 is defined wherein the first gate electrode 145 of the first gate structure 165 contacts the second gate electrode 205 of the second gate structure 225. Moreover, some degree of alignment variation may exist between the first gate structure 165 and the second gate structure 810B. In some embodiments, a first long axis 275A is defined along a center of the first gate structure 165, and a second long axis 275B is defined along a center of the second gate structure 225. In some embodiments, the first long axis 275A is parallel to the second long axis 275B. Due to the alignment variation, the first long axis 275A is laterally offset with respect to the second long axis 275B.

In some embodiments, the first active region 102A is associated with a first transistor 280A, and the second active region 102B is associated with a second transistor 280B. The first gate structure 165 and the second gate structure 225 define a shared gate structure for the first transistor 280A and the second transistor 280B because the first gate structure 165 is electrically coupled to the second gate structure 225 due to the first gate structure 165 contacting the second gate structure 225 at the interface 270. In some embodiments, the dopant used to form the first doped region 155 of the first transistor 280A has a first dopant type, and the dopant used to form the third doped region 215 of the second transistor 280B has a second dopant type different from the first dopant type. In some embodiments, the first dopant type comprises an n-type dopant and the second dopant type comprises a p-type dopant. In some embodiments, the first transistor 280A is an nMOS transistor and the second transistor 280B is a pMOS transistor. In some embodiments, the first transistor 280A and the second transistor 280B define an inverter circuit in a static random access memory (SRAM) cell having a shared gate structure defined by the first gate structure 165 and the second gate structure 225.

According to some embodiments, the use of the first gate mask 122 as an etch template for forming the first gate electrode 145, and the use of the first gate mask 122 and the first gate electrode 145 as an implantation template facilitates the formation of the first doped region 155 with an increased depth resulting from an increased implantation energy. The first doped region 155 is formed at the increased depth without introducing dopant into the gate dielectric layer 110 and introducing hot carrier injection defects. In some embodiments, the implantation process 150 is a vertical implantation process. Compared to angled implantation processes for forming LDD regions, the use of a vertical implantation process reduces threshold voltage mismatches. In some embodiments, the use of the second gate mask 202 as an etch template for forming the second gate electrode 205, and the use of the second gate mask 202 and the gate electrode 210 as an implantation template provides similar advantages for the third doped region 215.

In some embodiments, a method of forming a semiconductor arrangement includes forming a gate dielectric layer over a semiconductor layer. A gate electrode layer is formed over the gate dielectric layer. A first gate mask is formed over the gate electrode layer. The gate electrode layer is etched using the first gate mask as an etch template to form a first gate electrode. A first dopant is implanted into the semiconductor layer using the first gate mask and the first gate electrode as an implantation template to form a first doped region in the semiconductor layer.

In some embodiments, a method of forming a semiconductor arrangement includes forming a gate dielectric layer over a semiconductor layer. A gate electrode layer is formed over the gate dielectric layer. A first gate mask is formed over the gate electrode layer. The gate electrode layer is etched using the first gate mask as an etch template to form a first gate electrode. A first dopant is implanted into the semiconductor layer using the first gate mask as an implantation template to form a first doped region in the semiconductor layer. The first doped region extends to a first depth below a top surface of the semiconductor layer. A first sidewall spacer is formed adjacent the first gate electrode after implanting the first dopant. A second dopant is implanted using the first sidewall spacer and the first gate electrode as an implantation template to form a second doped region in the semiconductor layer. The second doped region extends to a second depth below the top surface of the semiconductor layer. The second depth is less than the first depth.

In some embodiments, a semiconductor arrangement includes a first transistor including a first gate structure over a semiconductor layer and a first doped region in the semiconductor layer adjacent the first gate structure. A second transistor includes a second gate structure over the semiconductor layer and a second doped region in the semiconductor layer adjacent the second gate structure. The second gate structure contacts the first gate structure such that an interface is defined between the first gate structure and the second gate structure.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
a first transistor, comprising:
   a first source/drain region;
   a second source/drain region;
   a first gate electrode between the first source/drain region and the second source/drain region;
   a first sidewall spacer; and
   a second sidewall spacer, wherein the second sidewall spacer is separated from the first gate electrode by the first sidewall spacer; and
a second transistor, comprising:
   a second gate electrode contacting the first gate electrode at a sidewall extending in a direction parallel to a direction extending from the first source/drain region to the second source/drain region; and
   the second sidewall spacer, wherein the second sidewall spacer is in contact with the second gate electrode.

2. The semiconductor arrangement of claim 1, wherein the second gate electrode contacts the first gate electrode such that an interface is defined between the first gate electrode and the second gate electrode.

3. The semiconductor arrangement of claim 2, wherein a center of the second gate electrode is laterally offset from a center of the first gate electrode at the interface.

4. The semiconductor arrangement of claim 1, wherein:
the first transistor comprises a first doped region,
the first source/drain region is a second doped region over the first doped region, and
the first doped region underlies the first sidewall spacer and the second sidewall spacer.

5. The semiconductor arrangement of claim 4, wherein the second doped region underlies the second sidewall spacer.

6. The semiconductor arrangement of claim 1, wherein:
the first sidewall spacer has a first material composition, and
the second sidewall spacer has a second material composition different than the first material composition.

7. The semiconductor arrangement of claim 1, wherein the second transistor is a p-type metal-oxide semiconductor (pMOS) device and the first transistor is an n-type metal-oxide semiconductor (nMOS) device.

8. A semiconductor arrangement, comprising:
a first transistor comprising:
   a first source/drain region;
   a second source/drain region; and
   a first gate structure comprising a first sidewall spacer having a first material composition, wherein the first gate structure is between the first source/drain region and the second source/drain region; and
a second transistor comprising a second gate structure, wherein:
   the second gate structure contacts the first gate structure at a sidewall extending in a direction parallel to a direction extending from the first source/drain region to the second source/drain region such that an interface is defined between the first gate structure and the second gate structure, and
   the second gate structure comprises a second sidewall spacer having a second material composition different than the first material composition.

9. The semiconductor arrangement of claim 8, wherein a center of the second gate structure is laterally offset from a center of the first gate structure at the interface.

10. The semiconductor arrangement of claim 8, wherein:
the first gate structure comprises a first gate electrode,
the first sidewall spacer is in contact with the first gate electrode,
the second gate structure comprises a second gate electrode, and
the second sidewall spacer is in contact with the second gate electrode.

11. The semiconductor arrangement of claim 10, wherein the first transistor comprises the second sidewall spacer.

12. The semiconductor arrangement of claim 8, wherein the first sidewall spacer comprises silicon and nitrogen.

13. The semiconductor arrangement of claim 8, wherein the second transistor is a p-type metal-oxide semiconductor (pMOS) device and the first transistor is an n-type metal-oxide semiconductor (nMOS) device.

14. A method comprising:
forming a gate electrode layer;
forming a first photoresist layer over the gate electrode layer;
removing a first portion of the first photoresist layer to define a patterned first photoresist layer;
removing a first portion of the gate electrode layer not underlying the patterned first photoresist layer to define a first gate electrode from a second portion the gate electrode layer;
removing the patterned first photoresist layer after defining the first gate electrode;
forming a second photoresist layer over first gate electrode and a third portion of the gate electrode layer;
removing a first portion of the second photoresist layer to define a patterned second photoresist layer; and
removing a first part of the third portion of the gate electrode layer not underlying the patterned second photoresist layer to define a second gate electrode from a second part of the third portion of the gate electrode layer.

15. The method of claim 14, comprising:
performing an implantation process to implant a first dopant into a substrate after removing the first portion of the gate electrode layer and before removing the patterned first photoresist layer.

16. The method of claim 14, comprising:
forming a first sidewall spacer adjacent the first gate electrode before forming the second photoresist layer.

17. The method of claim 16, comprising:
performing a first implantation process to implant a first dopant into a substrate after removing the first portion of the gate electrode layer and before removing the patterned first photoresist layer; and
performing a second implantation process to implant a second dopant into the substrate after forming the first sidewall spacer and before forming the second photoresist layer.

18. The method of claim 14, comprising:
forming a first sidewall spacer adjacent the first gate electrode before forming the second photoresist layer; and
forming a second sidewall spacer adjacent the first sidewall spacer after removing the first part of the third portion of the gate electrode layer.

19. The method of claim 14, comprising:
forming a sidewall spacer around the first gate electrode after removing the first part of the third portion of the gate electrode layer.

20. The semiconductor arrangement of claim 8, wherein:
the first transistor comprises a first doped region,
the first source/drain region is a second doped region over the first doped region, and
the first doped region underlies the first sidewall spacer.

* * * * *